US005455126A

United States Patent [19]
Bates et al.

[11] Patent Number: 5,455,126
[45] Date of Patent: Oct. 3, 1995

[54] ELECTRA-OPTICAL DEVICE INCLUDING A NITROGEN CONTAINING ELECTROLYTE

[75] Inventors: John B. Bates, Oak Ridge; Nancy J. Dudney, Knoxville; Greg R. Gruzalski, Oak Ridge; Christopher F. Luck, Knoxville, all of Tenn.

[73] Assignee: Martin Marietta Energy Systems, Inc., Oak Ridge, Tenn.

[21] Appl. No.: 248,935

[22] Filed: May 25, 1994

Related U.S. Application Data

[62] Division of Ser. No. 921,538, Jul. 29, 1992, Pat. No. 5,338,625.

[51] Int. Cl.$^6$ .................................................... H01M 6/00
[52] U.S. Cl. ..................... 429/127; 429/192; 429/193; 429/194; 429/218; 429/247; 429/248; 359/265; 359/275; 204/421
[58] Field of Search .................................... 359/265, 275; 429/192, 193, 194, 218, 247, 248, 127; 204/421

[56] References Cited

U.S. PATENT DOCUMENTS

| | | | |
|---|---|---|---|
| 5,142,406 | 8/1992 | Lampert et al. | 359/275 |
| 5,206,756 | 4/1993 | Cheshire | 359/265 |

*Primary Examiner*—Kathryn Gorgos
*Assistant Examiner*—Bruce F. Bell
*Attorney, Agent, or Firm*—George L. Craig; James M. Spicer; Harold W. Adams

[57] ABSTRACT

Described is a thin-film battery, especially a thin-film microbattery, and a method for making same having application as a backup or primary integrated power source for electronic devices. The battery includes a novel electrolyte which is electrochemically stable and does not react with the lithium anode and a novel vanadium oxide cathode Configured as a microbattery, the battery can be fabricated directly onto a semiconductor chip, onto the semiconductor die or onto any portion of the chip carrier. The battery can be fabricated to any specified size or shape to meet the requirements of a particular application. The battery is fabricated of solid state materials and is capable of operation between $-15°$ C. and $150°$ C.

3 Claims, No Drawings

ELECTRA-OPTICAL DEVICE INCLUDING A NITROGEN CONTAINING ELECTROLYTE

This invention was made with Government support under Contract No. DE-AC05-84OR21400 awarded by the U.S. Department of Energy to Martin Marietta Energy Systems, Inc. The Government has certain rights in this invention.

This application is a division of application Ser. No. 07/921,538, filed 29 Jul. 1992, now U.S. Pat. No. 5,338,625.

BACKGROUND OF INVENTION

1. Field of Invention

The invention is directed to a thin-film battery and a method for making same. More particularly, the invention is directed to a new thin-film lithium battery having a novel electrolyte permitting a battery to be fabricated having greatly enhanced energy density and specific energy over conventionally available batteries. The invention is also directed to a novel cathode permitting a battery to be fabricated having significantly enhanced energy densities over conventionally available batteries.

Conventional electro-optical devices known as "smart windows" are typically formed as a layered structure having a first electrode such as an anode layer, an electrochromic layer, an electrolyte or conductive layer and a second electrode such as a cathode layer, all of which are optically transparent. A limitation of such conventional electro-optical devices is that the electrolyte or conductive layer tends to be unstable and react with the electrodes. Any of such conventional electro-optical devices may be made choice of conventional materials for the electrodes and electrochromic layers by one skilled in the art and using the novel electrolyte claimed by Applicants for the conventional electrolyte layer. The enhanced stability of Applicants' novel electrolyte arising from the inclusion of nitrogen provides for electro-optical devices having enhanced performance over conventional devices.

2. Description of Prior Art

A battery is one of two kinds of electrochemical devices that convert the energy released in a chemical reaction directly into electrical energy. In a battery, the reactants are stored close together within the battery itself, whereas in a fuel cell the reactants are stored externally. The attractiveness of batteries as an efficient source of power is that the conversion of chemical energy to electrical energy is potentially 100% efficient although the loss due to internal resistance is a major limiting factor. This potential efficiency is considerably greater than the conversion of thermal energy to mechanical energy as used in internal combustion engines, which always results in heat transfer losses. Moreover, the additional disadvantages of contaminants emitted into the atmosphere as byproducts of incomplete combustion and dwindling availability of fuel supplies have intensified research into batteries as an alternative source of energy.

One limitation of conventional batteries is that they use toxic materials such as lead, cadmium, mercury and various acid electrolytes that are facing strict regulation or outright banning as manufacturing materials. Another limitation is that the amount of energy stored and/or delivered by the battery is generally directly related to its size and weight. At one end of the development spectrum, automobile batteries produce large amounts of current but have such low energy densities and specific energies due to their size and weight and such relatively lengthy recharge times that their usage as a source of propulsion is impractical. At the other end of the development spectrum, small, light, lithium batteries used to power small electronic appliances and semiconductor devices have much higher energy densities and specific energies but have not had the capability to be scaled up to provide the high energy for high power applications such as use in automobiles. Further, these small, light, lithium batteries have low charge-discharge cycle capability, limited rechargeability and, even where scaled down for microelectronics applications, size that frequently is many times larger than the semiconductor chip on which they are used.

Thin-film battery technology is foreseen as having several advantages over conventional battery technology in that battery cell components can be prepared as thin, e.g. 1 micron, sheets built up in layers using techniques common to the electronics industry according to the desired application. The area of the sheets can be varied from sizes achievable with present lithographic techniques to a few square meters providing a wide range in battery capacity. Deposition of thin films places the anode close to the cathode resulting in high current density, high cell efficiency and a great reduction in the amount of reactants used. This is because the transport of ions is easier and faster in thin film layers since the distance the ions must move is lessened.

Most critical to battery performance is the choice of electrolyte. It is known that the principle limitation on rechargeability of prior batteries is failure of the electrolyte. Battery failure after a number of charge-discharge cycles and the loss of charge on standing is caused by reaction between the anode and the electrolyte, e.g. attack of the lithium anode on the lithium electrolyte in lithium batteries. An extra process step of coating the anode with a protective material adds to the complexity, size and cost of the battery.

The power and energy density of a battery is also dependent upon the nature of the cathode. To achieve optimum performance, the open circuit voltage and current density on discharge should be as high as possible, the recharge rate should be high and the battery should be able to withstand many charge-discharge cycles with no degradation of performance. The vanadium oxide cathode of the present invention has a much higher capacity per mole than the crystalline $TiS_2$ of prior art cathodes.

The present invention avoids the limitations of present battery design and provides a novel battery having application as a battery used with manufacture of semiconductor components and as a high energy, high current macrobattery with appropriate scale-up of the described processes. The present invention includes a novel electrolyte having a good conductivity but more importantly it has electrochemical stability at high cell potentials and requires no protective layer between it and the anode during battery fabrication or use. The present invention also includes a novel cathode having a microstructure providing excellent charge/discharge properties.

SUMMARY OF THE INVENTION

A primary object of invention is to provide a new thin-film battery and a method for making same.

A second object of invention is to provide a new electrolyte for a thin-film battery in which the electrolyte has good ionic conductivity and is not reactive with the battery anode.

Another object of invention is to provide a method for making an improved electrolyte for a thin-film battery.

A yet further object of invention is to provide a new cathode having improved microstructure for a thin-film battery and a method for making same.

These and other objects are achieved by depositing a pair of current collecting films on a substrate; depositing an amorphous cathode layer on the larger of the two collecting films; depositing an amorphous lithium phosphorus oxynitride electrolyte layer over the cathode; and depositing a metallic anode layer over the electrolyte.

BRIEF DESCRIPTION OF THE DRAWING

FIG. 1 is a schematic diagram of a thin-film battery deposited onto a semiconductor chip package with current leads extending to a semiconductor chip.

FIGS. 2A–2D illustrates the layers in plan view to form a thin-film battery according to the present invention.

FIG. 3 schematically illustrates a cross-sectional view of a thin-film battery made according to the present invention.

FIG. 4A is a micrograph of a vanadium oxide cathode formed by a sputtering process where the target is aged due to prior sputtering and the process gas flow rate is less than about 15 sccm.

FIG. 4B is a micrograph of a vanadium oxide cathode formed by a sputtering process where the target is fresh and the process gas flow rate is greater than about 15 sccm.

FIG. 5 illustrates the charge-discharge performance for a microbattery made according to the present invention.

DESCRIPTION OF THE PREFERRED EMBODIMENTS

There are many possible uses for a thin-film, rechargeable battery as a primary or standby power source for low current electronic devices. A thin-film cell could be fabricated directly onto the semiconductor chip, the chip package or the chip carrier and could be fabricated to any specified size or shape to meet the requirements of a particular application. Referring to FIG. 1, a possible application is shown in which a thin-film cell 10 is deposited onto a semiconductor chip package 12 with current leads 14 extending to the chip 16. A Li-VO$_x$ cell about 8 microns thick occupying an area of 1 square centimeter as shown has a capacity of 130 microAmp-hours and could supply a current of up to 100 microAmps at a voltage ranging from 3.7 volts at full charge to about 1.5 volts near the end of its discharge. If a larger battery were deposited over the unused area of the package, the capacity and current density of the battery could of course be increased.

With reference to FIGS. 2A–D, the steps in fabricating such a single cell are shown. Two current collectors, vanadium for example, are deposited as a larger and a smaller 0.5 micron thick film, 18 and 20 respectively, on a substrate 22 such as glass, alumina, sapphire or various semiconductor or polymer materials. The films may be deposited by rf or dc magnetron sputtering or diode sputtering of vanadium in Argon, vacuum evaporation or other such film deposition techniques common to the semiconductor electronics industry. Similarly, an amorphous vanadium-oxide, VO$_x$, cathode 24 is deposited as a 1 micron thick film over the larger current collector 18 by sputtering vanadium in Argon+ 14%O$_2$. An amorphous oxynitride lithium electrolyte film 26 is then deposited over the cathode 24 by sputtering of Li$_3$PO$_4$, lithium orthophosphate, in 20 milliTorr of N$_2$ and a total gas flow of 14 sccm. As before, various film deposition techniques may be used for fabrication of the vitreous electrolyte film 26 although reactive DC sputtering is not available when lithium orthophosphate is the target as it is an insulator material and would accumulate charge until the deposition process stopped. Example targets for the described microbattery measured 25 millimeters in diameter by 3 millimeters thick and were prepared by cold pressing lithium orthophosphate powder followed by sintering of the pressed disc in air at 900° C. Deposition of a 1 micron thick film was carried out over a period of 16–21 hours at an average rate of 8–10 Angstroms per minute. The film 26 has the composition Li$_x$PO$_y$N$_z$ where x has the approximate value of 2.8; 2y+3z has the approximate value of 7.8; and z has the approximate value of 0.16 to 0.46. Deposition of a film 28 of lithium over the vitreous electrolyte film 26, the intervening substrate 22 and the smaller current collector 20 completes the cell. A typical film thickness for the lithium film 28 is about 5 microns. FIG. 3 is a schematic cross-section view of FIG. 2D.

Example performance characteristics of such a battery as described above are an open circuit voltage of 3.6 to 3.8 volts and, for a 1 micron thick cathode, a capacity of about 130 microAmp-hours per square centimeter for a discharge to 1.5 volts. The battery is capable of producing a discharge current of up to 2 milliAmps per square centimeter and can be recharged at a current of at least 20 microAmps per square centimeter. The battery has been subjected to more than 100 charge/discharge cycles with no degradation in performance and, after the first few cycles, the efficiency of the charge/discharge process was approximately 100%. Further, the vitreous oxynitride lithium electrolyte 26 has demonstrated long-term stability in contact with the lithium anode 28 such that the battery does not require the extra protective film, typically lithium iodide, to prevent reaction of the lithium anode with the electrolyte.

Performance of thin-film batteries has been critically limited by the properties of the chosen electrolyte. For rechargeable lithium batteries, the electrolyte should have a high lithium ion conductivity and it must be chemically stable in contact with lithium. Films deposited by sputtering or evaporation of inorganic compounds onto substrates held at ambient temperatures are usually amorphous. This is advantageous because, for many lithium compounds, the lithium ion conductivity of the amorphous phase is orders of magnitude higher than that of the crystalline phase and the conductance of the amorphous film is often adequate for use an as electrolyte. As many of these amorphous materials have acceptable low electronic conductivities, there is a wide choice of materials available for possible application in thin-film cells which meet the first two requirements. However, instability in contact with lithium eliminates many materials from consideration and has limited development of a thin-film lithium cell. The amorphous lithium phosphorus oxynitride film 26 of the present invention is made by sputtering Li$_3$PO$_4$ in pure N$_2$ and has both the desired electrical properties and the stability in contact with lithium for fabrication of electrochemical cells.

A comparison of the conductivities at 25° C. for several electrolyte compositions in the lithium phosphosilicate system achieved by sputtering lithium silicates and lithium phosphates in Ar and Ar+O$_2$ is shown in Table 1. The lithium phosphosilicate listed had the highest conductivity of the films in the Li$_2$O:SiO$_2$:P$_2$O$_5$ system. Several of the more highly conductive lithium phosphosilicate films with different compositions were investigated as the electrolyte for lithium cells. In each case, the lithium anode 28 reacted with the electrolyte film 26. However, the electrolyte of the present invention was found to be stable in contact with the lithium anode although it contained only about 2 to 6 at. % nitrogen. Moreover, as shown in Table 1, the conductivity is more than 30 times greater than that of the film deposited by sputtering $Li_3PO_4$ in 40% $O_2$ in Argon. Incorporation of nitrogen into the thin films of the present invention increases conductivity at least five times greater than similarly prepared films containing no nitrogen. The increase in conductivity is due to an increase in lithium ion mobility rather than an increase in the number of charge carriers brought about by a change in the structure of the electrolyte. Further, such cells appear to be stable indefinitely, exhibiting only a small voltage loss which is considered to occur due to the electronic conductivity of the electrolyte.

TABLE 1

Comparison of amorphous lithium phosphate, phosphosilicate, and phosphorus oxynitride electrolyte films.

| Target | Process Gas | Film Composition | $\sigma(25° C.) \times 10^8$ (S/cm) | $E_2$ (eV) |
|---|---|---|---|---|
| $Li_3PO_4$ | 40% $O_2$ in Ar | $Li_{2.7}PO_{3.9}$ | 7 | 0.68 |
| $Li_3PO_4$ + $Li_4SiO_4$ | " | $Li_{4.4}Si_{0.23}PO_{5.2}$ | 20 | 0.57 |
| $Li_3PO_4$ | $N_2$ | $Li_{3.3}PO_{3.8}N_{0.22}$ | 240 | 0.56 |

The enhanced conductivity, superior mechanical properties of nitrided glass(e.g. hardness, resistance to fracture) and chemical stability of the oxynitride lithium electrolyte of the present invention could also be used to fabricate enhanced electro-optic devices using electrochromic layers, i.e. so called smart windows, because of the increased resistance to attack from water vapor.

The performance of the lithium microbattery of the present invention is also very dependent on formation of the cathode. Consideration of the microstructure of the cathode is equally as important as consideration of the composition. Typical of prior thin-film batteries is the use cathodes having a characteristic crystalline microstructure. The microstructure is dependent on substrate temperature, extent of the erosion of the target material due to prior sputtering and the pressure and composition of the process gas during deposition. At substrate temperatures of 400° C., vanadium oxide cathodes, for example, consist of crystalline platelets standing on edge while films deposited onto substrates at about 50° C. consist of clusters of crystalline fibrous bundles. With reference to FIG. 4, two distinct types of microstructure are shown for vanadium oxide films deposited by reactive sputtering of vanadium. When deposited from an eroded target, the cathode films 28 were characterized by a high density of micron-sized fibrous clusters in FIG. 4A of crystalline $V_2O_5$. When a fresh target surface is used and the flow rate is increased to about 20 sccm, the microstructure of the cathode 28 has the smooth microstructure shown in FIG. 4B. The advantage achieved with the amorphous structure over the crystalline structure is that at least three times more lithium ions can be inserted into cathode 28 having such amorphous structure, thus resulting in a lithium cell of much higher capacity.

As the sputtering target, e.g. vanadium, ages, the microstructure of the films deposited with higher flow rates gradually evolves to that of the films having fibrous clusters characteristic of deposition at the lower flow rates. This change in the films is evident by a decrease in sputtered target voltage (at constant power) and as much as a 30% decrease in deposition rate.

Lithium cells fabricated with crystalline or amorphous vanadium oxide cathodes had open circuit voltages of 3.6 to 3.7 volts. However, compared with amorphous cathodes, the rates of discharge and charge that the cells with the crystalline cathodes could sustain without excessive polarization are significantly lower, usually less than 3 microAmps per square centimeter. This probably results from poor transport across the interface between the electrolyte 26 and the cathode 28 since the electrolyte 26 does not conformably coat the fibrous clusters of the crystalline cathode 28 but rather covers just the top portion, resulting in a relatively small contact area.

Lithium cells made according to the present invention having the lithium phosphorus oxynitride electrolyte 26 and the smooth amorphous cathode 28 may be discharged at rates of up to 3 milliAmps per square centimeter. With reference to FIG. 5, a set of charge-discharge curves for one cycle of such a cell is shown. The total charge passed through this cell between 3.64 volts and 1.5 volts is about 575 milliCoulombs. The capacity of the cell over this voltage range is 130 microAmp-hours per square centimeter with an energy density of $1.2 \times 10^6$ Joules per kilogram based on combined masses of the cathode, electrolyte and anode.

The greatly enhanced energy density achievable with thin-film batteries made according to the present invention may, with suitable scaling of process parameters, permit fabrication of high energy thin-film macrobatteries. For example, according to the present teachings, a 25-kWh thin-film lithium battery could be constructed by connecting in series approximately 46 large-area thin-film cells. Such a battery would have an average voltage of 165 volts, a weight of 67 kilograms, a volume of 36 liters, a specific energy of 370 Watt-hours per kilogram and an energy density of 690 Watt-hours per liter.

While there has been shown and described what is at present considered the preferred embodiment of the invention, it will be obvious to those skilled in the art that various changes and modifications may be made therein without departing from the scope of the invention as defined by the appended claims.

What is claimed is:

1. An electro-optical device comprising:
   a) an optically transparent anode of a first electrically conductive material;
   b) an optically transparent electrochromic material overlaying said anode;
   c) an optically transparent electrolyte containing nitrogen therein overlaying said electrochromic material; and
   d) an optically transparent cathode overlaying said electrolyte.

2. The electro-optical device of claim 1 wherein said electrolyte has the composition $Li_xPO_yN_z$ where x has an approximate value of 2.8, 2y+3z has an approximate value of 7.8 and z has a value between 0.16 and 0.46.

3. The electro-optical device of claim 1 wherein said cathode is comprised of vanadium oxide having a fine-grain morphology.

* * * * *